United States Patent
Kamiya

[11] Patent Number: 6,057,702
[45] Date of Patent: *May 2, 2000

[54] BUS DRIVER

[75] Inventor: Hiroshi Kamiya, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/701,691

[22] Filed: Aug. 22, 1996

[30] Foreign Application Priority Data

Aug. 24, 1995 [JP] Japan ..................... 7-239151
Apr. 5, 1996 [JP] Japan ..................... 8-110488

[51] Int. Cl.[7] ........................................ H03K 19/0185
[52] U.S. Cl. .................. 326/26; 326/27; 326/86; 326/90
[58] Field of Search ................... 326/26–27, 83, 326/86, 119, 82, 112, 57–58, 30, 90

[56] References Cited

U.S. PATENT DOCUMENTS

| | | | |
|---|---|---|---|
| 4,754,170 | 6/1988 | Toda et al. ............................ | 326/27 |
| 4,990,802 | 2/1991 | Smooha ............................... | 326/30 |
| 5,136,187 | 8/1992 | Ceccherelli et al. ................. | 326/30 |
| 5,311,083 | 5/1994 | Wanlass ............................... | 326/21 |
| 5,416,361 | 5/1995 | John et al. ........................... | 327/379 |
| 5,568,060 | 10/1996 | Bartholomay et al. .............. | 326/86 |

FOREIGN PATENT DOCUMENTS

| | | | |
|---|---|---|---|
| 2242313 | 9/1990 | Japan . | |
| 3-38112 | 2/1991 | Japan ................................... | 326/27 |
| 4-38011 | 2/1992 | Japan ................................... | 326/27 |
| 8-251000 | 9/1996 | Japan . | |

*Primary Examiner*—Jon Santamauro
*Attorney, Agent, or Firm*—Whitham, Curtis & Whitham

[57] ABSTRACT

A bus driver reduces a ringing produced in the output waveform thereof. In the output waveform traveling over a bus, the ringing is produced due to reflections of the output waveform at a plurality of LSI packages. In the bus driver, at least one diode is connected between a transistor for driving a signal and a power supply source. The diode of the bus driver clamps waveform components having a potential higher than a predetermined threshold on the bus and reduces ringings of the bus driver output waveform.

20 Claims, 19 Drawing Sheets

1

BUS DRIVER

BACKGROUND OF THE INVENTION

The present invention relates to a bus driver, particularly, to a bus driver capable of reducing a ringing produced in the output waveform thereof.

Bus drivers of this type are conventionally provided in each of a plurality of electronic circuit packages and each of the packages is electrically connected to a bus through the bus drivers.

FIG. 17 is a schematic diagram for showing the connection between a plurality of electronic circuit packages and a bus. In FIG. 17, a bus B comprises a plurality of connectors C1, . . . , and C7 and bus terminating resistors R1 and R2. Connectors C1, . . . , and C7 are connected to electronic circuit packages, such as LSI (Large Scale Integration) packages, PKG-1, . . . , and PKG-7, respectively. Each of the connectors C1, . . . , and C7 is connected to each of PKG-1, . . . , and PKG-7 through a stub. Bus terminating resistors R1 and R2 terminate both the ends of bus B. Each of PKG-1, . . . , and PKG-7 is provided with bus drivers.

As shown in FIG. 18, a conventional bus driver has an open-drain-type structure using a MOS (Metal Oxide Semiconductor) transistor 109. That is, a source terminal S of MOS transistor 109 is connected to the ground level and a drain terminal D thereof is connected to an output terminal T. When a signal to be output from an LSI package is applied to a gate terminal G of MOS transistor 109 through an input terminal I of the bus driver, MOS transistor 109 is turned on or off in accordance with the state of the signal. When MOS transistor 109 is turned on, output terminal T becomes ground-level. When MOS transistor 109 is turned off, output terminal T is brought into a floating state.

In FIGS. 17 and 18, output terminal T of bus driver 19 is connected to connectors C1, . . . , and C7.

An example of this type of bus driver is disclosed in Japanese Patent Application Laid-Open No. Hei 2-242313.

In the case of the bus B, it is assumed that the distance between connectors C1 and C2 is 1.4 in., the distance between connectors C2 and C3, 2.0 in., the distance between connectors C3 and C4, 1.8 in., the distance between connectors C4 and C5, 1.8 in., the distance between connectors C5 and C6, 2.0 in., and the distance between connectors C6 and C7, 1.0 in. Moreover, it is assumed that the length of a stub from a circuit element on each LSI package to a connector is 1.0 in. when each LSI package is connected to the connector. Furthermore, it is assumed that the resistances of terminating resistors R1 and R2 are both 56 and resistors R1 and R2 are connected to 1.5-V DC power supply VT. In this case, simulation waveforms at output terminals of bus drivers of LSI packages PKG-1, PKG-3, . . . , and PKG-7 obtained by an output waveform from the output terminal of the bus driver of LSI package PKG-3 connected to connector C3 are shown in FIG. 19.

Curve 73 is a waveform of the LSI package PKG-3, curve 74 is a waveform of the LSI package PKG-4, curve 71 is a waveform of the LSI package PKG-1, curve 75 is a waveform of the LSI package PKG-5, curve 76 is a waveform of LSI package PKG-6, and curve 77 is a waveform of LSI package PKG-7. In FIG. 19, x-axis shows voltage value "bolt" and y-axis shows time "nanosecond".

As shown in FIG. 19, a ringing is produced in each output waveform at the rise time of the output waveform of the bus driver of LSI package PKG-3, that is, when the MOS transistor in the bus driver changes from on to off states. Particularly, curve 75 which is the waveform of LSI package PKG-5 has a lot of ringings and it is hardly kept in a range.

Therefore, a conventional bus driver has a problem that a ringing occurs in an output waveform.

This may be caused by reflections at both ends of each line constituting a bus. The ringing waveform in curve 75 vertically vibrates abov of below 1.5 V which is a terminating potential and particularly, it may be lower than V1 which is approximately 1.0 V.

As described above, because a considerably large ringing occurs in the conventional bus driver, it is difficult to transmit a signal with a narrow pulse width or a high repetitive frequency. Therefore, there is a problem that it is difficult to use a conventional bus driver in data transfer over a high-speed bus.

An object of the present invention is therefore to provide a bus driver capable of reducing a ringing produced in the output waveform thereof.

SUMMARY OF THE INVENTION

According to an aspect of the present invention, there is provided a bus driver which comprises an input terminal, an output terminal connected to a bus, a transistor for driving a signal applied from said input terminal and outputting said signal to said output terminal, and a diode connected between said transistor and a power supply source.

According to another aspect of the present invention, there is provided a bus driver which comprises an input terminal, an output terminal connected to a bus, a transistor for driving a signal applied from said input terminal and outputting said signal to said output terminal, and a circuit having a diode and a capacitive element connected between said transistor and power supply source.

BRIEF DESCRIPTION OF DRAWINGS

Other features and advantages of the invention will be made more apparent by the detailed description hereunder taken in conjunction with the accompanying drawings, wherein.

In the drawings, the same reference numerals represent the same structural elements.

DETAILED DESCRIPTION OF THE PREFERRED EMBODIMENTS

First, a first embodiment of the present invention is described below in detail, referring to FIG. 1.

Figure 1:
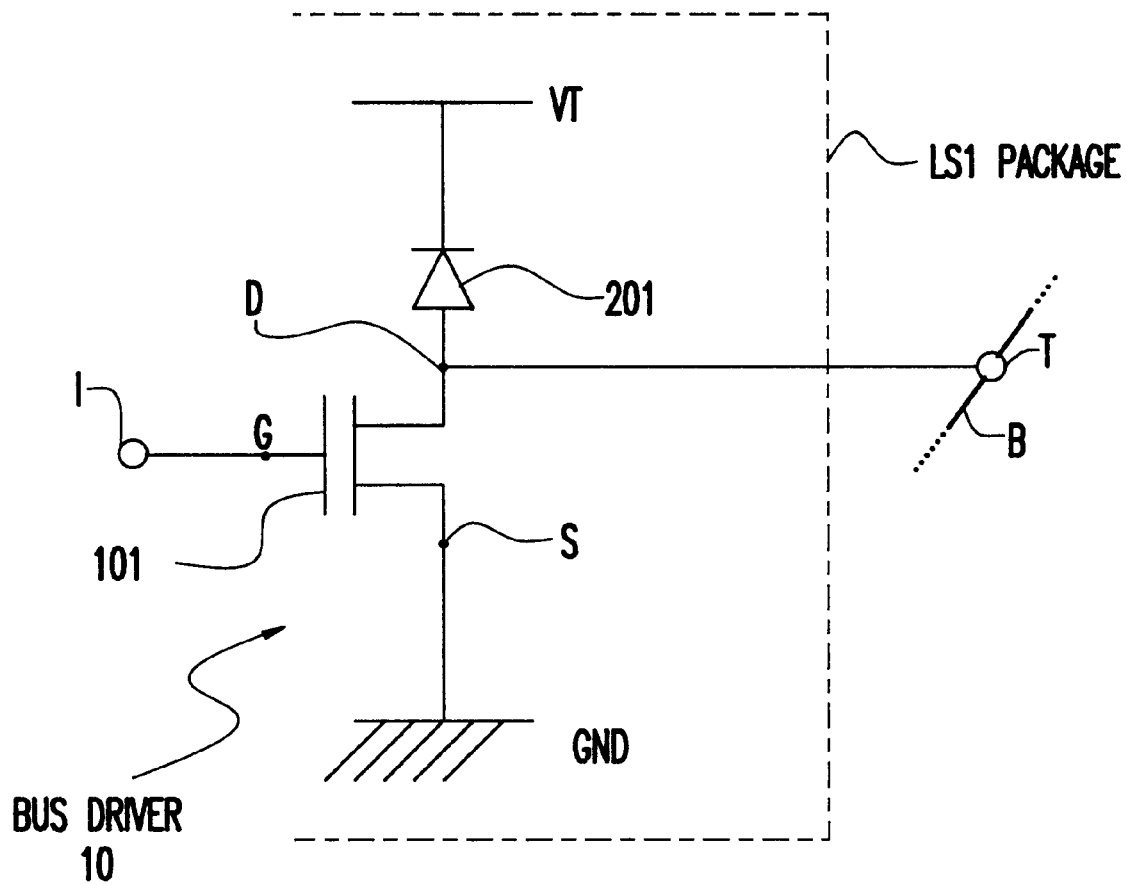
FIG. 1 is a circuit diagram of a first embodiment of the present invention.

In FIG. 1, bus driver 10 comprises input terminal I to which an output signal to be output from an LSI package is applied, output terminal T connected to bus B, MOS transistor 101, and diode 201.

Gate G of MOS transistor 101 is connected to input terminal I of bus driver 10, source S is connected to a low-potential power supply, and drain D is connected to output terminal T of bus driver 10. The low-potential power supply is the ground GND in the case of this embodiment. The anode of diode 201 is connected to drain D of MOS transistor 101 and the cathode of thereof connected to a high-potential power supply source. The high-potential power supply has a bus terminating potential of 1.5 V in the case of this embodiment. A Schottky diode is used as diode 201. In this case, the forward voltage Vf of diode 201 is 0.4 V. Diode 201 is provided between drain D of MOS transistor 101 and bus terminating potential VT.

An operation of this embodiment is described below.

Figure 2:
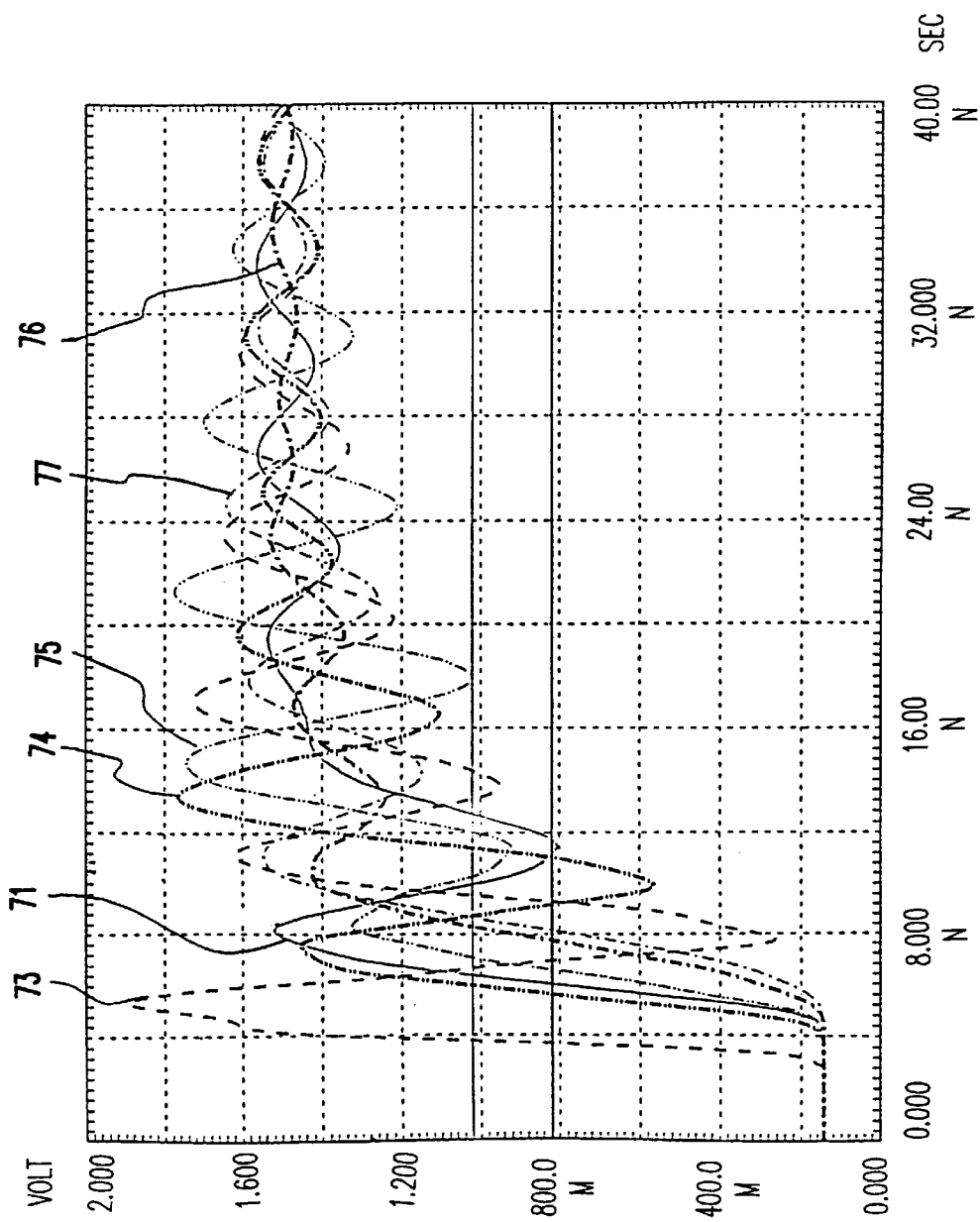
FIG. 2 is a waveform diagram of the first embodiment of the present invention.

In FIGS. 1 and 2, when MOS transistor 101 changes from an on-state to off-state, an output waveform which is transmitted from the output terminal of bus driver 10 to a bus first takes a transient state and then converges to a bus terminating voltage of 1.5 V.

In the output waveform traveling over the bus, a ringing, namely, a vibration swinging above or below the bus terminating voltage is produced due to reflections of the output waveform at a plurality of LSI packages. Diode 201 clamps waveform components having a potential higher than (VT+Vf) on the bus and reduces ringings of the bus driver output waveform. More specifically, waveform components having a potential higher than (VT+Vf) on the bus are discharged to a high-potential power supply terminal through diode 201.

Figure 17:
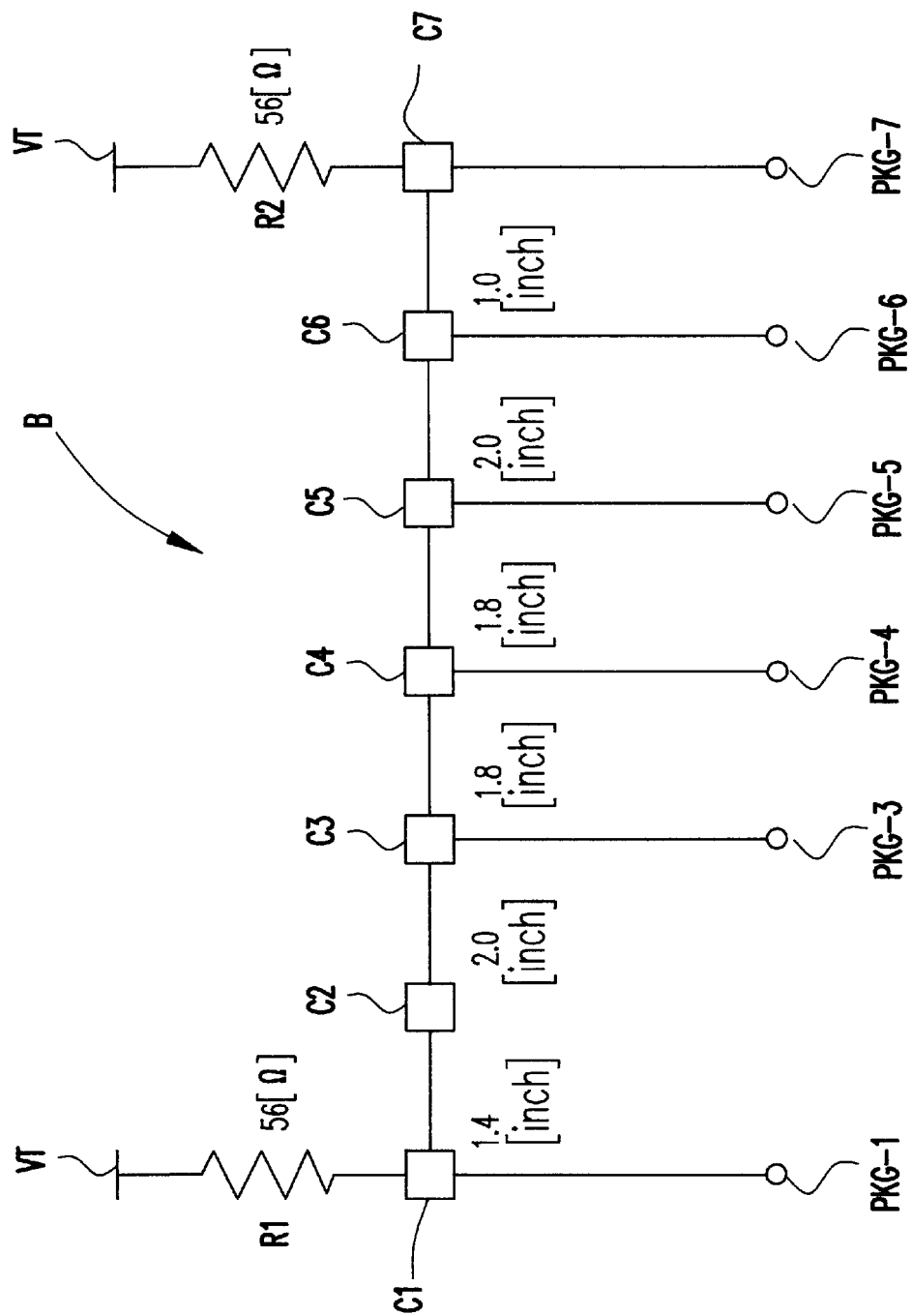
FIG. 17 is a schematic diagram for showing the connection between a plurality of electronic circuit packages and a bus.
Figure 18:
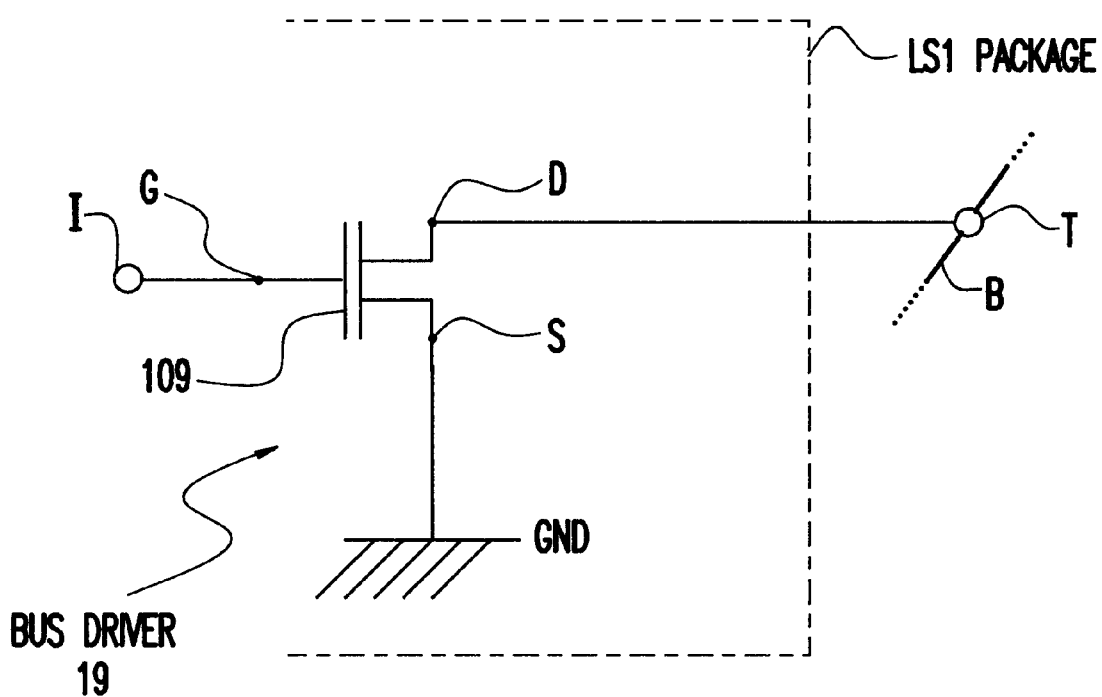
FIG. 18 is a diagram illustrating the structure of a conventional bus driver.
Figure 19:
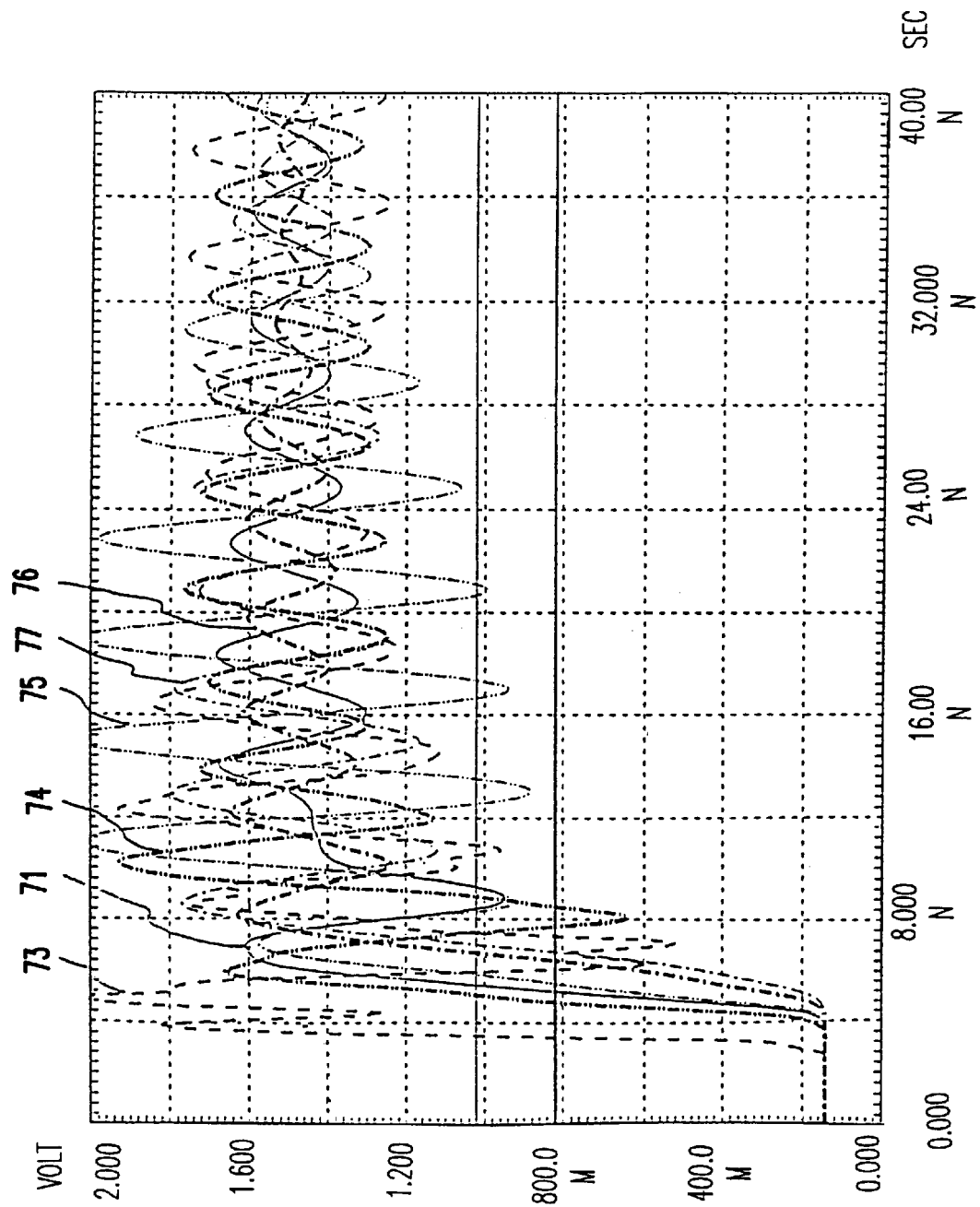
FIG. 19 is a waveform diagram of the conventional bus driver.

FIG. 2 shows simulation results of output waveforms of LSI packages while bus driver 10 on one of the LSI packages is connected to the bus in FIG. 17. As is apparent from FIG. 2, it is found that ringings in this embodiment converge more quickly than those in the conventional bus driver shown in FIG. 19.

Next, a second embodiment of the present invention is described below. In the second embodiment, an NPN transistor is used instead of the MOS transistor of the first embodiment. The other structural elements are the same as those of the first embodiment.

Figure 3:
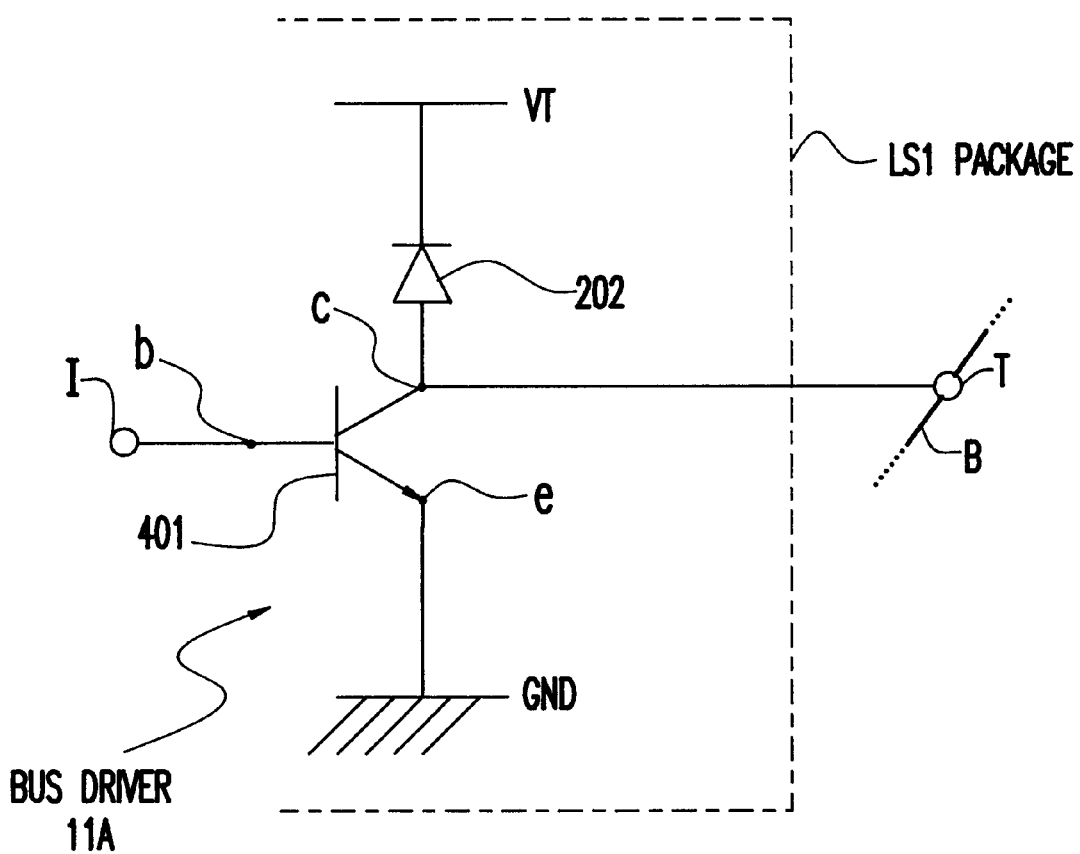
FIG. 3 is a circuit diagram of a second embodiment of the present invention.

In FIG. 3, base b of NPN transistor 401 is connected to input terminal I of bus driver 11a, emitter e is connected to a low-potential power supply, and collector c is connected to output terminal T of bus driver 11a. The low-potential power supply source is the ground GND in the case of this embodiment. The anode of diode 202 is connected to collector c of NPN transistor 401 and the cathode of it is connected to a high-potential power supply source.

Figure 4:
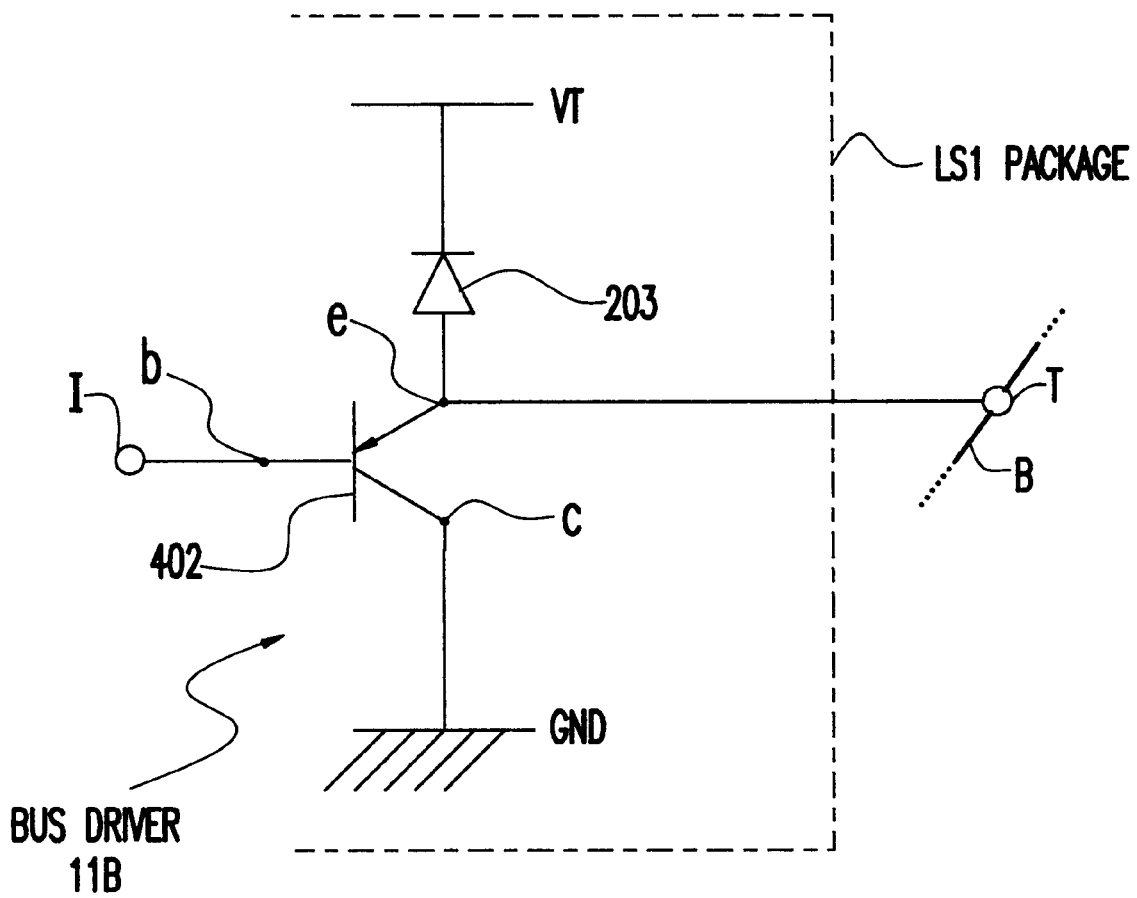
FIG. 4 is another circuit diagram of the second embodiment of the present invention.

FIG. 4 shows a case of using a PNP transistor instead of the NPN transistor in the embodiment shown in FIG. 3. Base b of PNP transistor 402 is connected to input terminal I of bus driver 11b, collector c is connected to a low-potential power supply source, and emitter e is connected to output terminal T of bus driver 11b. The anode of diode 203 is connected to emitter e of PNP transistor 402 and the cathode is connected to a high-potential power supply source.

Next, a third embodiment of the present invention is described below. In the third embodiment, a plurality of diodes are connected in series. The other structural elements are the same as those of the first embodiment.

Figure 5:
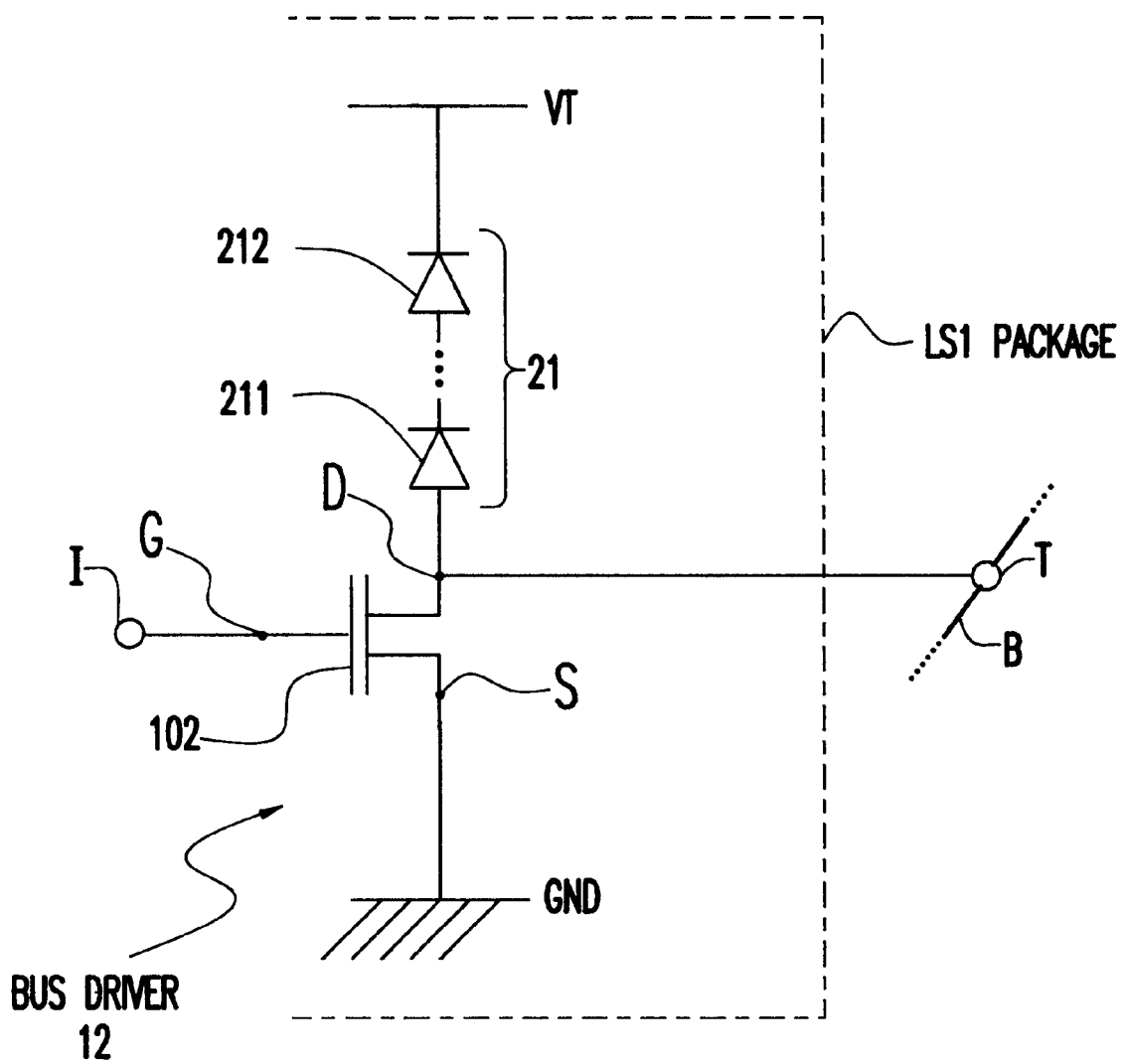
FIG. 5 is a circuit diagram of a third embodiment of the present invention.

In FIG. 5, in the third embodiment, bus driver 12 includes diode group 21 comprising a plurality of diodes 211, . . . , and 212 connected in series. Diode group 21 is provided between drain D of MOS transistor 102 of the bus driver and the bus terminating potential. The anode of diode 211 is connected to drain D of MOS transistor 102 and the cathode of diode 212 is connected to a high-potential power supply. In the case of this embodiment, it is assumed that the number of diodes 211, . . . , and 212 is N (N is an integer not less than 2) and the forward potentials of the diodes are all Vf.

An operation of this embodiment is described below.

In FIG. 5, diode group 21 clamps waveform components having a potential higher than (VT+N Vf) on the bus and reduces ringings from an output waveform of bus driver 12. More specifically, waveform components having a potential higher than (VT+N Vf) on the bus are discharged to a high-potential power supply terminal through diode group 21. This embodiment makes it possible to more easily adjust the ringing reduction potential level (VT+N Vf) by adjusting the number of diodes constituting diode group 21.

This embodiment can use an NPN transistor instead of a MOS transistor. In this case, the base of the NPN transistor is connected to input terminal I, the emitter is connected to a low-potential power supply source, and the collector is connected to the anode of diode 211. Moreover, it is possible to use a PNP transistor instead of a MOS transistor. In this case, the base of the PNP transistor is connected to input terminal I, the collector is connected to a low-potential power supply source, and the emitter is connected to the anode of diode 211.

Next, a fourth embodiment of the present invention is described below. In the fourth embodiment, a plurality of diodes are connected in parallel. The other structural elements are the same as those of the first embodiment.

Figure 6:
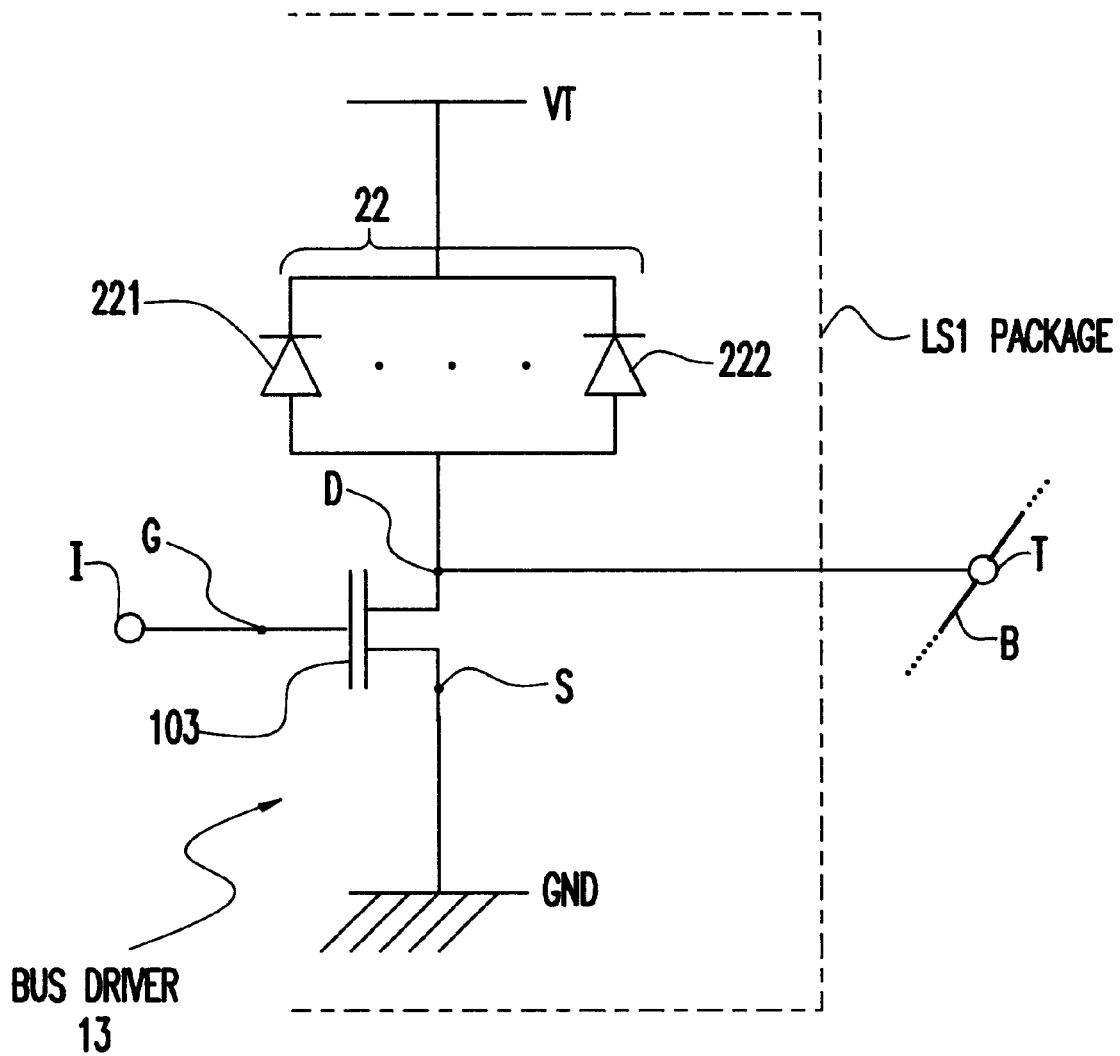
FIG. 6 is a circuit diagram of the fourth embodiment of the present invention.

In FIG. 6, in the fourth embodiment, bus driver 13 includes diode group 22 comprising a plurality of diodes 221, . . . , and 222 connected in parallel. Diode group 22 is provided between drain D of MOS transistor 103 of the bus driver and the bus terminating potential. The anode of each of diodes 221, . . . , and 222 is connected to drain D of MOS transistor 103 and the cathode of each of diodes 221, . . . , and 222 is connected to a high-potential power supply. It is assumed that the forward voltage of diode group 22, that is, the clamp voltage is Vfp.

An operation of this embodiment is described below.

In FIG. 6, diode group 22 clamps waveform components having a potential higher than (VT+Vfp) on the bus and reduces ringings of an output waveform of bus driver 13. More specifically, waveform components having a potential higher than (VT+Vfp) on the bus are discharged to a high-potential power supply terminal through diode group 22.

In the case of this embodiment, diode group 22 is provided between drain D of MOS transistor of the bus driver and the bus terminating potential. Therefore, the following two advantages are obtained.

First, to adjust a potential level for reducing ringings, it is only necessary to consider bus terminating potential value VT when the number of diodes constituting diode group 22 is large enough. That is, it is unnecessary to consider the clamp potential of each of a plurality of the diodes constituting diode group 22.

Second, because the current route area of diode group 22 increases proportionally to the number of diodes constituting the diode group, noise due to ringings is quickly removed and waveforms output from the bus driver to the bus more quickly converge.

This embodiment can use an NPN transistor instead of a MOS transistor. In this case, the base of the NPN transistor is connected to input terminal I, the emitter is connected to a low-potential power supply source, and the collector is connected to the anode of each of a plurality of diodes. Moreover, it is possible to use a PNP transistor instead of a MOS transistor. In this case, the base of the PNP transistor is connected to input terminal I, the collector is connected to a low-potential power supply source, and the emitter is connected to the anode of each of a plurality of diodes.

Next, a fifth embodiment of the present invention is described below. In the fifth embodiment, a diode is provided between a potential lower than the bus terminating potential and a transistor. The other structural elements are the same as those of the first embodiment.

Figure 7:
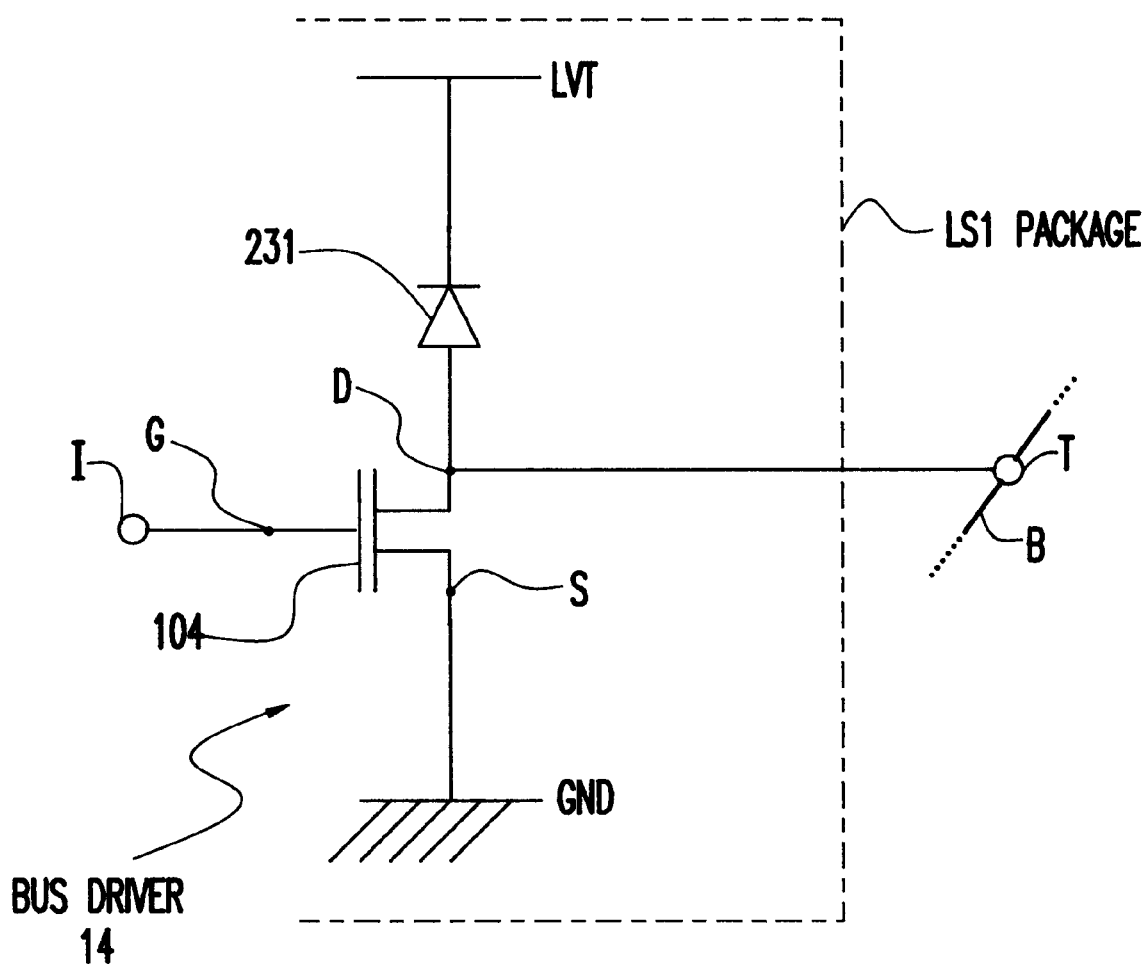
FIG. 7 is a circuit diagram of a fifth embodiment of the present invention.

In FIG. 7, in the fifth embodiment, diode 231 of bus driver 14 is provided between drain D of MOS transistor 104 and potential LVT lower than the bus terminating potential. The value of LVT is obtained by partially dividing the bus terminating potential by the general voltage resistance dividing technique.

An operation of this embodiment is described.

In FIG. 7, diode group 21 clamps waveform components having a potential higher than (LVT+Vf) on the bus and reduces ringings in an output waveform of bus driver 14. More specifically, waveform components having a potential higher than (LVT+Vf) on the bus is discharged to potential LVT lower than the bus terminating potential through diode 231.

Figure 8:
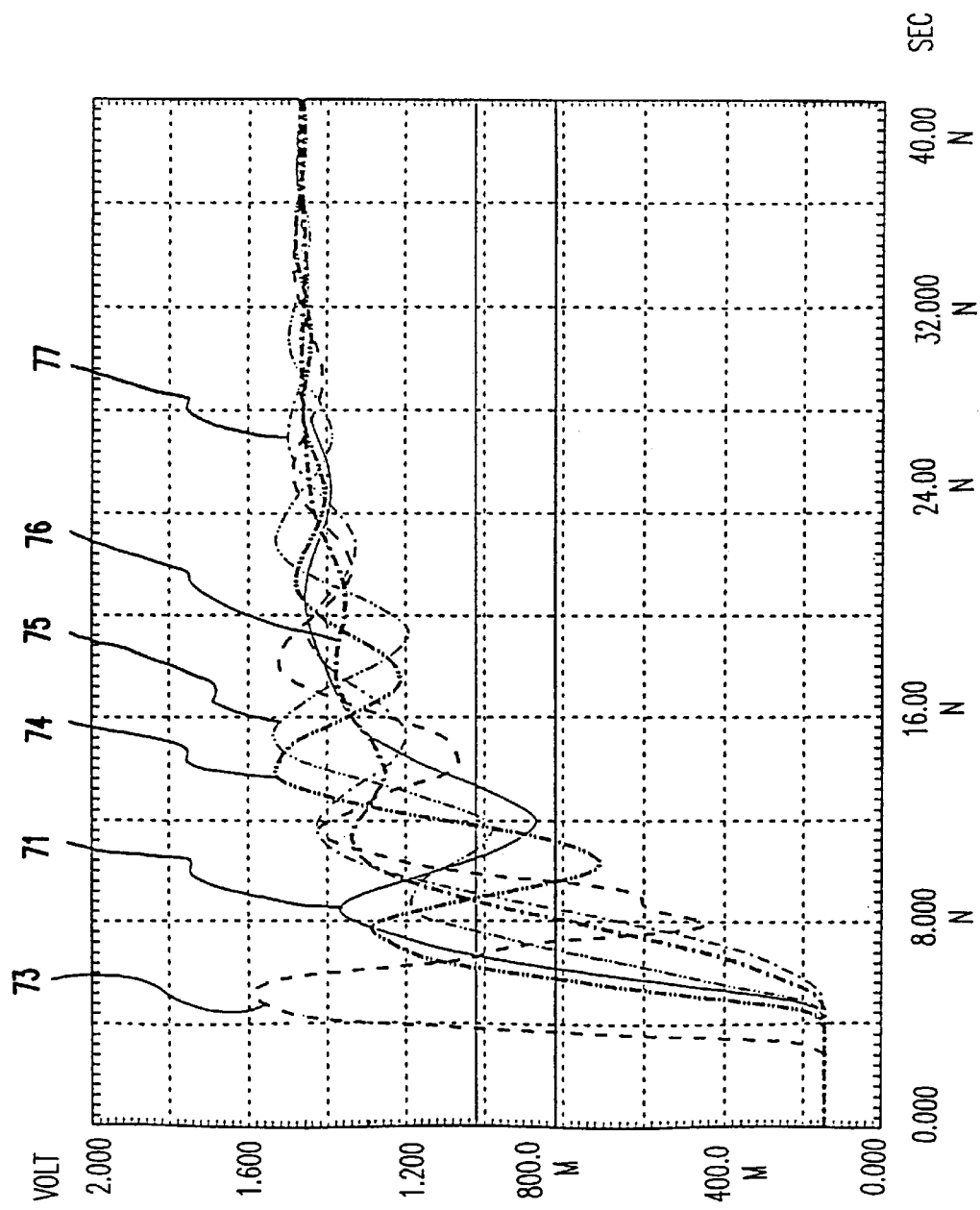
FIG. 8 is a waveform diagram of the fifth embodiment of the present invention.

FIG. 8 shows simulation results of waveforms of LSI packages while bus driver 14 in this embodiment is connected to the bus in FIG. 17. Ringings of an output waveform in bus driver 14 of this embodiment converge more quickly than those of an output waveform in the conventional bus driver shown in FIG. 19.

This embodiment makes it possible to freely set the ringing reduction potential level (LVT+Vf) by changing LVT value.

This embodiment can use an NPN transistor instead of a MOS transistor. In this case, the base of the NPN transistor is connected to input terminal I, the emitter is connected to a low-potential power supply source, and the collector is connected to the anode of a diode. Moreover, it is possible to use a PNP transistor instead of a MOS transistor. In this case, the base of the PNP transistor is connected to input terminal I, the collector is connected to a low-potential power supply source, and the emitter is connected to the anode of a diode.

Furthermore, in the case of the above second, third, or fourth embodiment, it is possible to set the value of the high-potential power supply terminal to a potential lower than the bus terminating potential.

Next, a sixth embodiment of the present invention is described below. In the sixth embodiment, a circuit comprising a diode and a capacitor is included. The other structural elements are the same as those of the first embodiment.

Figure 9:
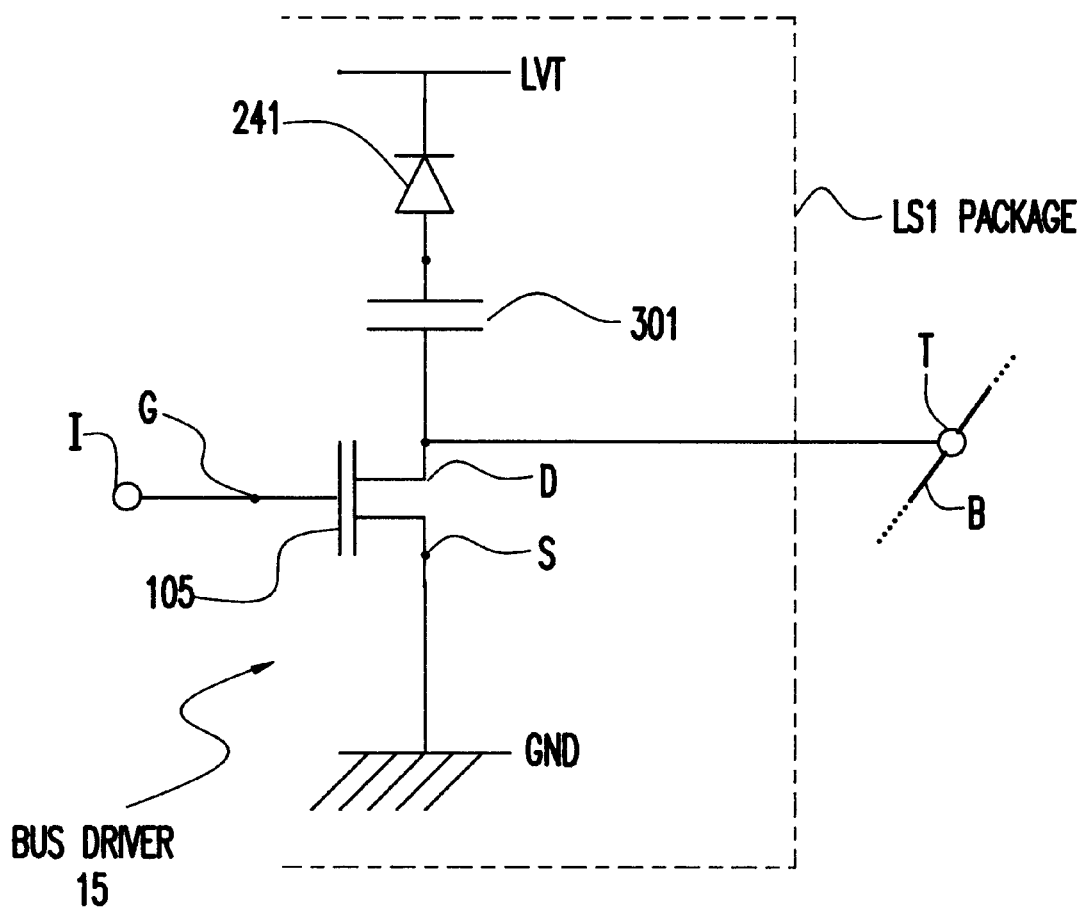
FIG. 9 is a circuit diagram of a sixth embodiment of the present invention.

In FIG. 9, a circuit constituted by connecting diode 241 and capacitor 301 in series is provided between drain D of MOS transistor 105 and a DC power supply kept at potential LVT lower than bus terminating potential VT in bus driver 15 of the sixth embodiment. One end of capacitor 301 is connected to drain D of MOS transistor 105 and the other end of capacitor 301 is connected to the anode portion of diode 241. The cathode portion of diode 212 is connected to potential LVT lower than bus terminating potential VT.

The value of potential LVT lower than bus terminating potential VT is set to a voltage value lower than 1.5 V because the bus terminating potential is 1.5 V. In this case, when a diode uses a PN diode, the value of potential LVT is set to 1.0 V by including a margin of 0.2 V in the case of this embodiment because forward voltage Vf is approx. 0.8 V in general.

An operation of this embodiment is described below.

In FIG. 9, capacitor 301 is charged at potential LVT lower than the bus terminating potential through an output terminal when MOS transistor 105 changes from an on-state to an off-state. Though this embodiment uses capacitor 301, it is also possible to use a part having a capacitance.

When a charge value for capacitor 301 exceeds a predetermined threshold determined by forward voltage Vf of diode 241 and the value of power supply LVT, diode 241 discharges electric charges stored in capacitor 301 to the power supply LVT side. Therefore, because capacitor 301 is charged when levels change and it is made to discharge electric charges when a charge value exceeds a predetermined threshold, turbulence of a rising waveform is absorbed and ringings quickly converge.

Figure 10:
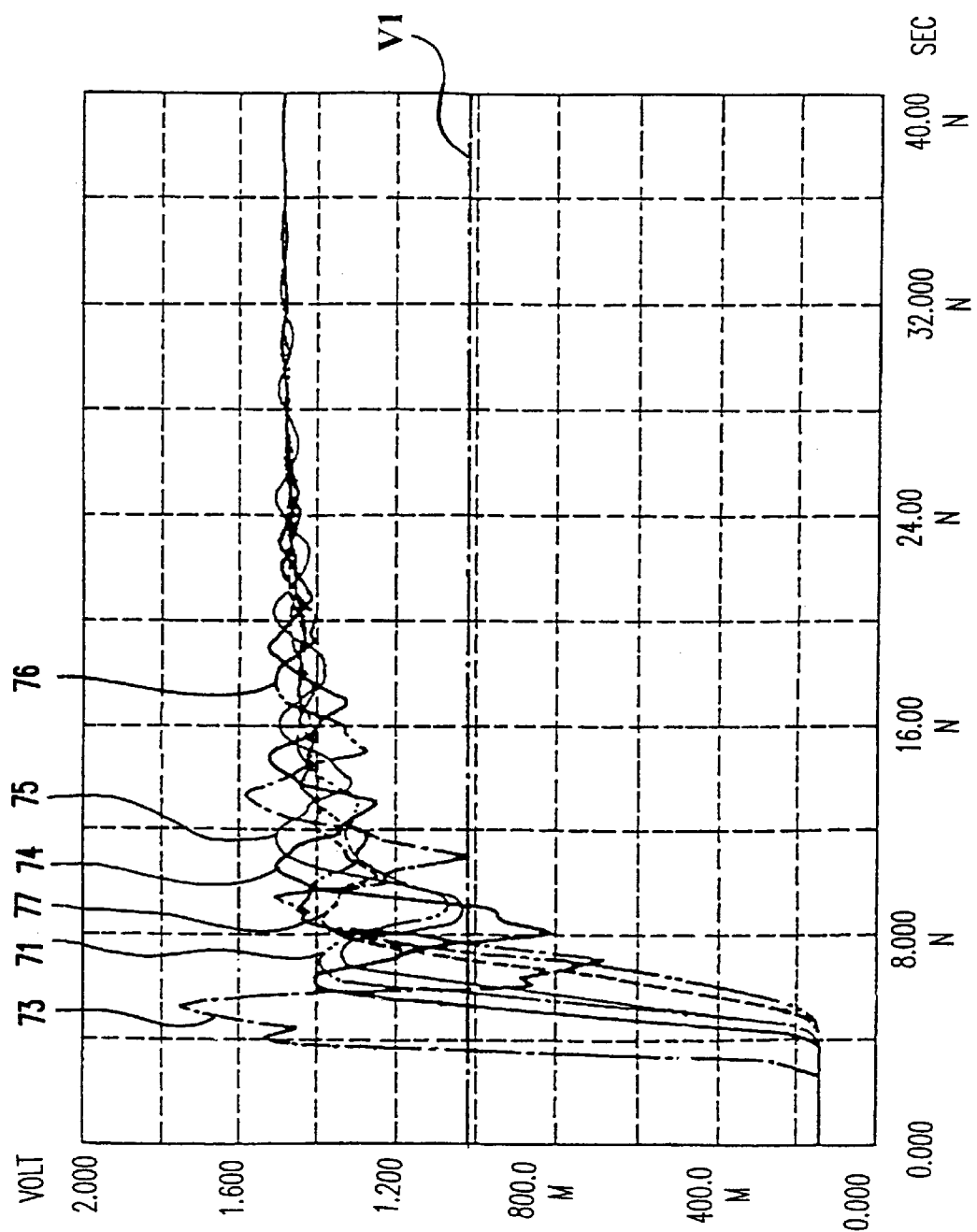
FIG. 10 is a waveform diagram of the sixth embodiment of the present invention.

FIG. 10 shows simulation results of waveforms of LSI packages while bus driver 15 in this embodiment is connected to the bus in FIG. 17. Ringings of an output waveform of bus driver 15 in this embodiment converge more quickly than those of an output waveform in a conventional bus driver. Therefore, by using bus driver 15 of this embodiment, it is possible to transmit a waveform with a narrow pulse width or a signal with a high repetitive frequency.

This embodiment uses a capacitor to be charged at a terminating potential when levels of a binary signal change. By making the capacitor discharge electric charges when a charge value for the capacitor exceeds a predetermined threshold, ringings quickly converge. Therefore, by using bus driver 15 of this embodiment, a high-speed bus is easily realized.

The same effect is obtained even by inversely connecting capacitor 301 and diode 241.

Moreover, though the value of power supply LVT is set to a potential lower than the bus terminating potential in the case of this embodiment, it is also possible to set the value to the bus terminating potential.

Furthermore, this embodiment can use an NPN transistor instead of a MOS transistor. In this case, the base of the NPN transistor is connected to input terminal I, the emitter is connected to a low-potential power supply source, and the collector is connected to capacitor 301. Furthermore, it is possible to use a PNP transistor instead of a MOS transistor. In this case, the base of the PNP transistor is connected to input terminal I, the collector is connected to a low-potential power supply source, and the emitter is connected to capacitor 301.

Now, a seventh embodiment of the present invention will be described in detail with reference to the drawings. Features of the seventh embodiment includes that a capacitor is provided between the diode and the power supply source LVT in the bus driver of the sixth embodiment. Other arrangement is same as that of the sixth embodiment.

Figure 11:
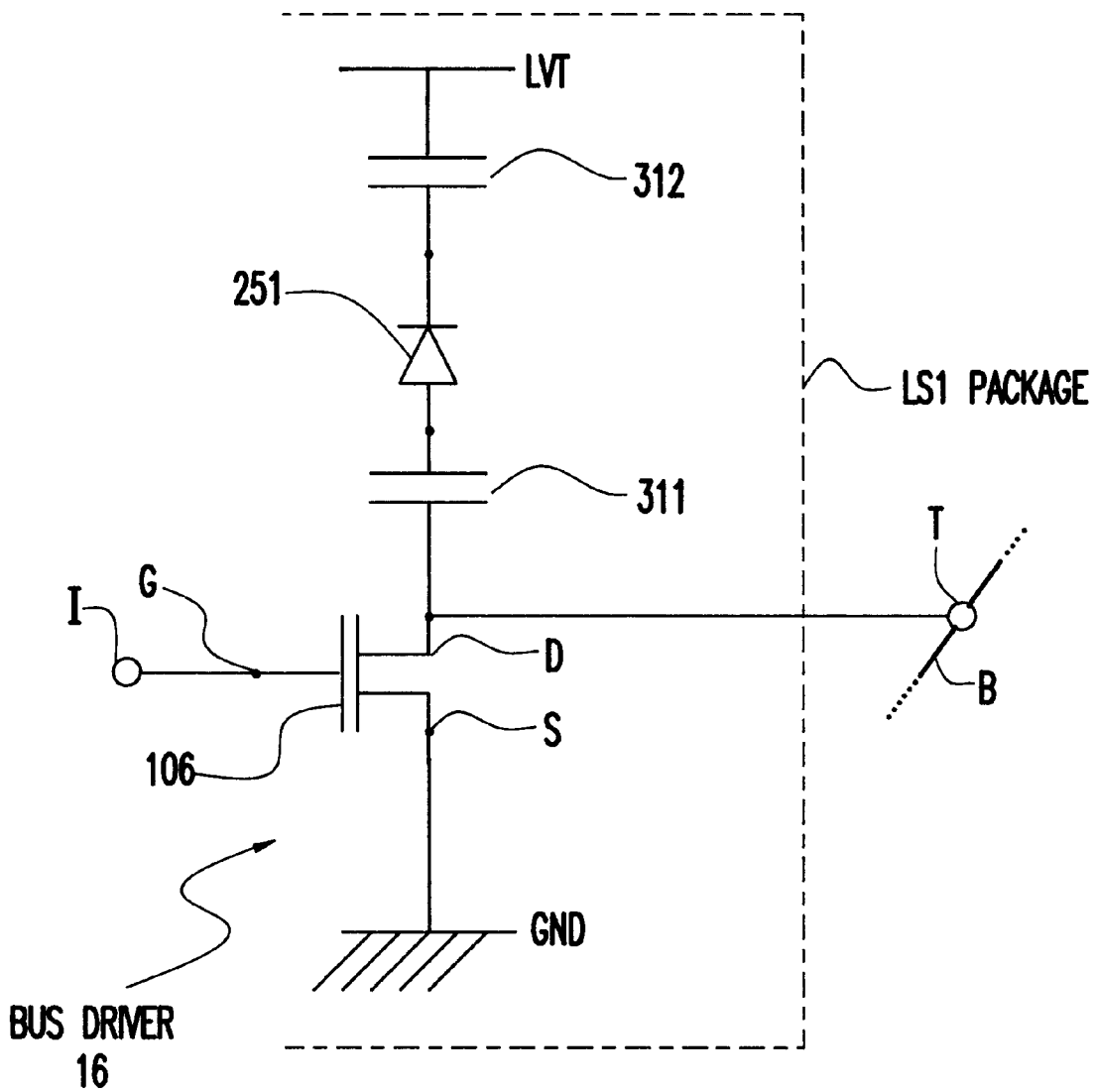
FIG. 11 is a circuit diagram of a seventh embodiment of the present invention.

Referring to FIG. 11, in the bus driver 16 of the sixth embodiment, a circuit in which a capacitor 311, a diode 251, and a capacitor 312 are connected in series is provided between the drain D of MOS transistor 106 and potential LVT lower than the terminal potential VT of the bus. One end of the capacitor 311 is connected to the drain D of MOS transistor 106, while the other end is connected to the anode of the diode 251. The cathode of the diode 251 is connected to one end of the capacitor 312, while the other end of the capacitor 312 is connected to the potential LVT lower than the terminal potential of VT of the bus.

An operation of this embodiment is described below.

In FIG. 11, capacitor 311 is charged when output levels of transistor 106 are changed. When a charge value for capacitor 311 exceeds a predetermined threshold, capacitor 311 is discharged by diode 251, capacitor 312 is charged. Electric charges stored in the capacitor 312 are discharged to the power supply LVT side.

Figure 12:
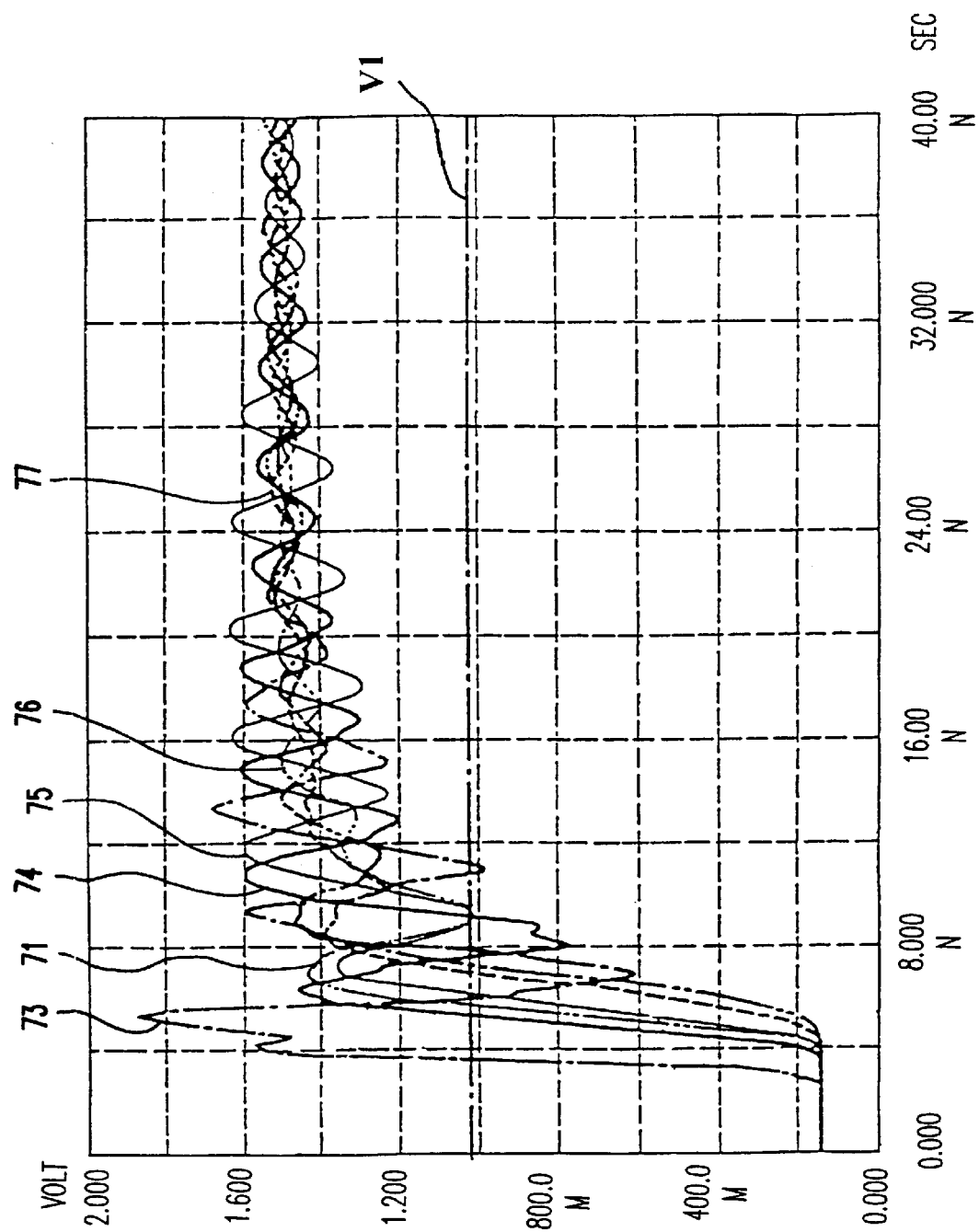
FIG. 12 is a waveform diagram of the seventh embodiment of the present invention.

FIG. 12 shows simulation results of waveforms of LSI packages while bus driver 16 in this embodiment is connected to the bus in FIG. 17. According to bus driver 16 in this embodiment, the rise time of each waveform is shortened compared to the case of FIG. 10. This is because two capacitors are connected in series.

This embodiment is provided with capacitor 311 to be charged at a terminating potential when levels of a binary signal are changed. Moreover, this embodiment is also provided with another capacitor 312. When a charge value for capacitor 311 exceeds a predetermined threshold, capacitor 312 discharge electric charges stored in capacitor 311 to power supply LVT. Therefore, ringings quickly converge and the rise time of each waveform is short and thereby, a higher-speed bus is realized.

Though this embodiment uses capacitors 311 and 312, it is also possible to use a part with a capacitance.

Moreover, because capacitor 312 is inserted, it is possible to provide some degrees of freedom for the voltage value of power supply LVT. For example, it is also possible to connect power supply terminal V to a ground potential.

Furthermore, this embodiment can use an NPN transistor instead of a MOS transistor. In this case, the base of the NPN transistor is connected to input terminal I, the emitter is connected to a low-potential power supply source, and the collector is connected to capacitor 311. Furthermore, it is possible to use a PNP transistor instead of a MOS transistor. In this case, the base of the PNP transistor is connected to input terminal I, the collector is connected to a low-potential power supply source, and the emitter is connected to capacitor 311.

Next, a eighth embodiment of the present invention is described below. In the eighth embodiment, a diode group comprising a plurality of diodes is included compared to the bus driver of the seventh embodiment. The other structural elements are the same as those of the seventh embodiment.

Figure 13:
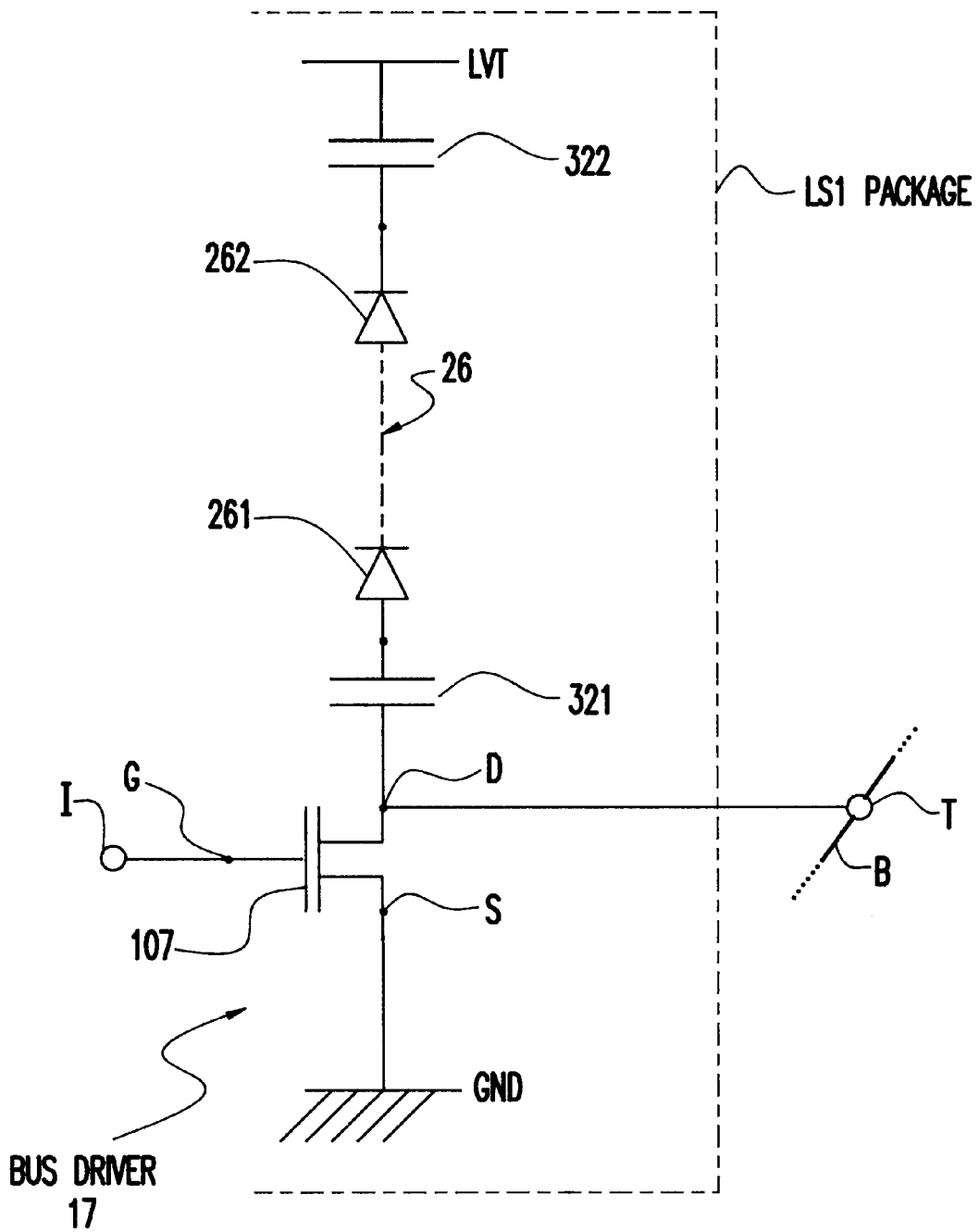
FIG. 13 is a circuit diagram of an eighth embodiment of the present invention.

In FIG. 13, a circuit constituted by connecting capacitor 321, diode group 26, and capacitor 322 in series is provided between drain D of MOS transistor 107 and potential LVT lower than bus terminating potential VT. Diode group 26 comprises a plurality of diodes 261, . . . , and 262. One end of capacitor 321 is connected to drain D of MOS transistor 107 and the other end of capacitor 321 is connected to the anode portion of diode 261 constituting the diode group. The cathode portion of diode 262 constituting the diode group is connected to one end of capacitor 322 and the other end of capacitor 322 is connected to potential LVT lower than bus terminating potential VT.

Figure 14:
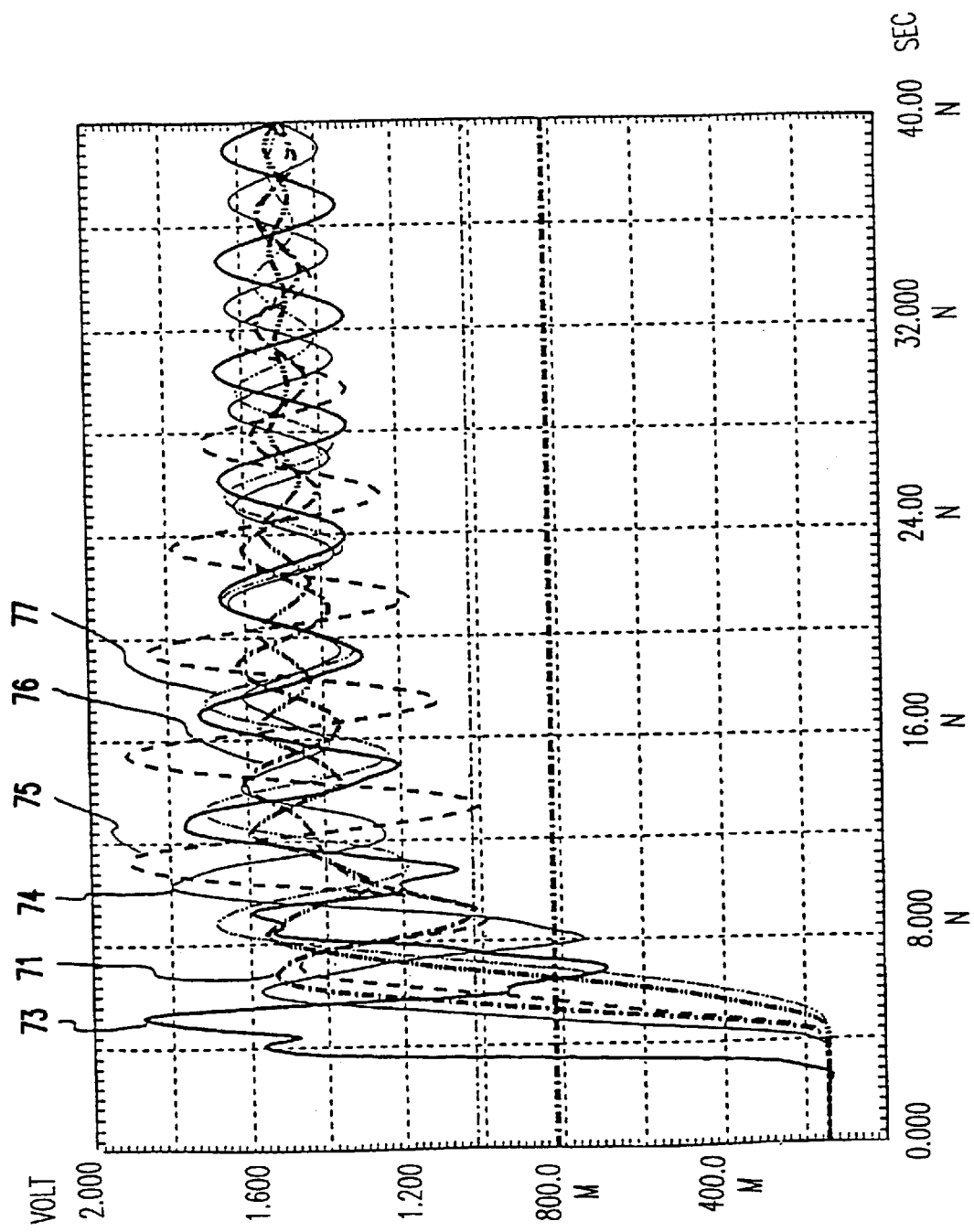
FIG. 14 is a waveform diagram of the eighth embodiment of the present invention.

FIG. 14 shows simulation results of waveforms of LSI packages while bus driver 17 in this embodiment is connected to the bus in FIG. 17. According to bus driver 17 in this embodiment, ringings of each waveform quickly converge compared to the case of FIG. 19.

This embodiment is provided with diode group 26 comprising a plurality of diodes 261, . . . , and 262. Therefore, a threshold for discharging electric charges stored in capacitor 321 to power supply terminal V can easily be adjusted by adjusting the number of diodes.

This embodiment can use an NPN transistor instead of a MOS transistor. In this case, the base of the NPN transistor is connected to input terminal I, the emitter is connected to a low-potential power supply source, and the collector is connected to capacitor 321. Moreover, it is possible to use a PNP transistor instead of a MOS transistor. In this case, the base of the PNP transistor is connected to input terminal I, the collector is connected to a low-potential power supply source, and the emitter is connected to capacitor 321.

Next, a ninth embodiment of the present invention is described below in detail by referring to the accompanying drawings.

Figure 15:
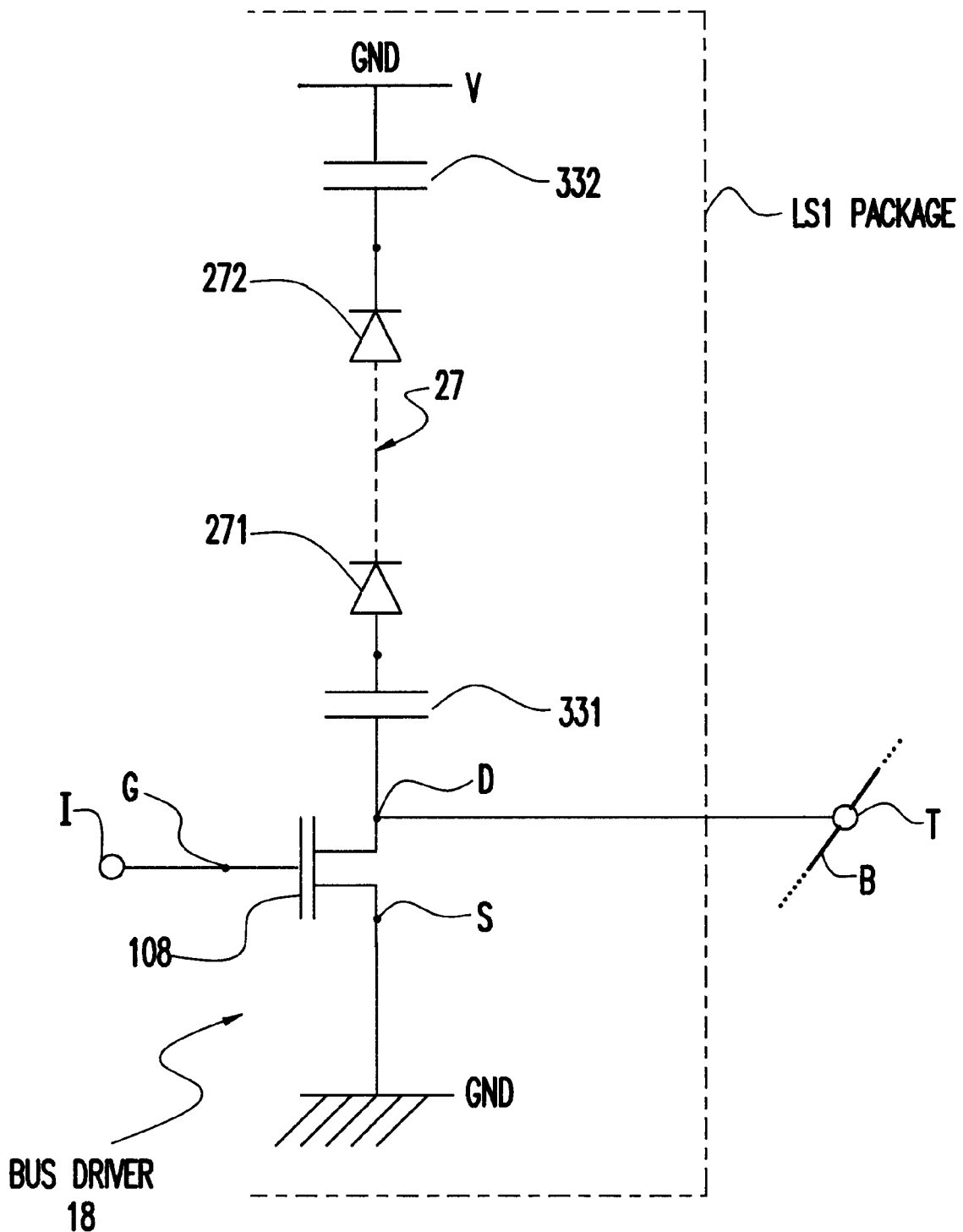
FIG. 15 is a circuit diagram of an ninth embodiment of the present invention.

In FIG. 15, power supply terminal V is connected to the ground potential. In the case of this embodiment, power supply terminal V is connected to a potential lower than the bus terminating potential. However, because capacitor 322 is inserted, it is possible to provide some degrees of freedom for the voltage value of power supply V.

Figure 16:
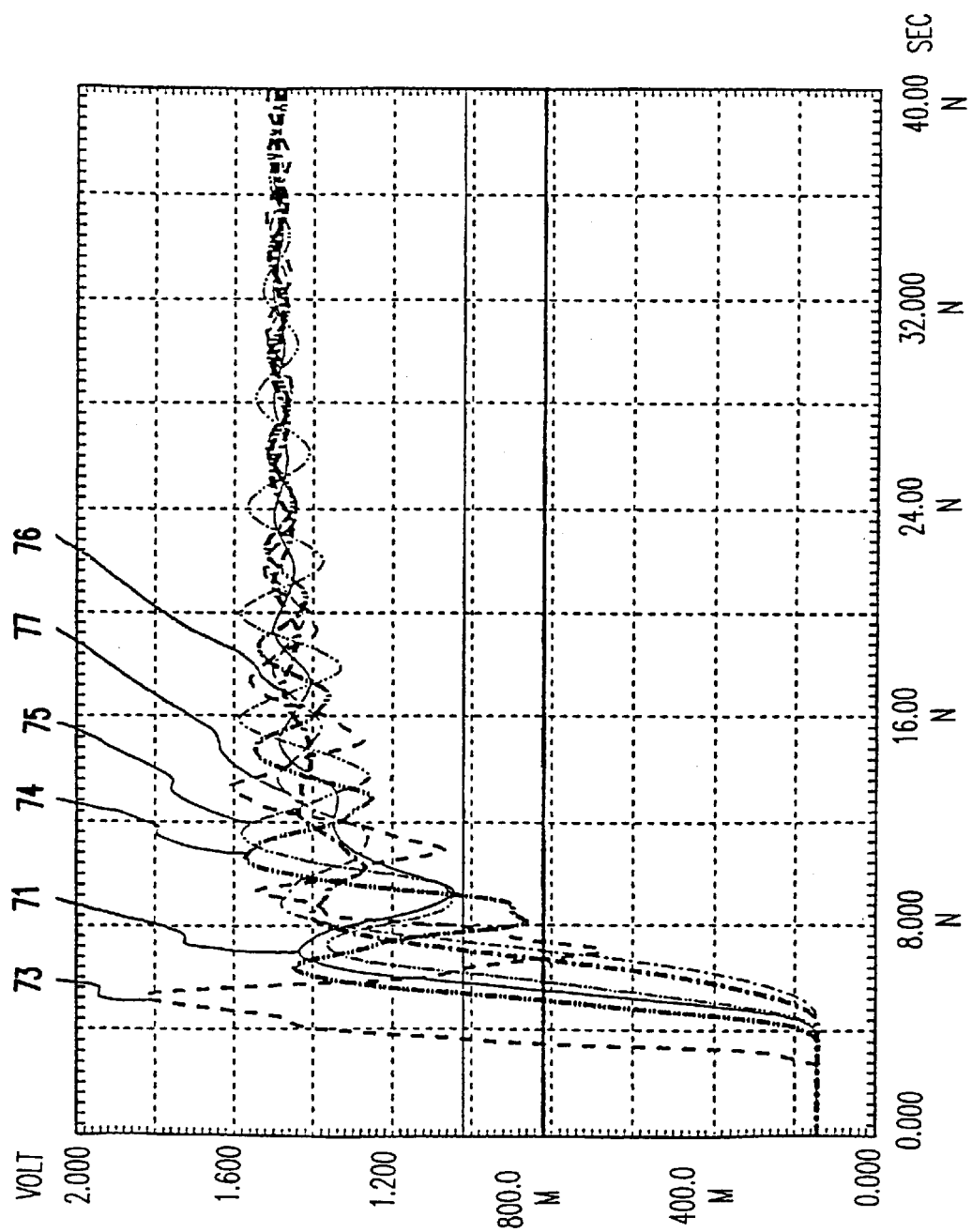
FIG. 16 is a waveform diagram of the ninth embodiment of the present invention.

FIG. 16 shows simulation results of waveforms of LSI packages while bus driver 18 in this embodiment is connected to the bus in FIG. 17. According to bus driver 18 in this embodiment, ringings of each waveform quickly converge compared to the case of FIG. 14.

In the case of this embodiment, power supply terminal V is connected to a ground potential. Therefore, it is unnecessary to partially divide the bus terminating potential and generate a potential for power supply terminal V.

This embodiment can use an NPN transistor instead of a MOS transistor. In this case, the base of the NPN transistor is connected to input terminal I, the emitter is connected to a low-potential power supply, and the collector is connected to capacitor 331. Moreover, it is possible to use a PNP transistor instead of a MOS transistor. In this case, the base of the PNP transistor is connected to input terminal I, the collector is connected to a low-potential power supply, and the emitter is connected to capacitor 331.

In the case of the above embodiments, it is clear that convergence of ringings can be accelerated not only for rise of a waveform but also for fall of a waveform.

Moreover, it is possible to use any one of a Schottky diode and a PN diode as a diode of the above embodiments.

As described above, in the case of the present invention, a diode is provided between drain D of a transistor of a bus driver and a terminating potential. Therefore, waveform components having a potential higher than a predetermined potential on a bus to which bus drivers are connected are clamped and ringings are recuced the output waveforms of the bus drivers.

While this invention has been described in conjunction with the preferred embodiments thereof, it will now readily be possible for those skilled in the art to put this invention into practice in various other manners.

What is claimed is:

1. A bus driver comprising:

an input terminal;

an output terminal connected to a bus having a bus terminating potential;

a transistor for driving a signal applied from said input terminal and outputting the driven signal to said output terminal, said transistor being connected between said output terminal and a first power supply source; and a diode connected between said output terminal and a second power supply source having a potential not higher than said bus terminating potential and not lower than a potential of said first power supply source, said diode forming a one-way current path from said output terminal to said second power supply source when a potential of said driven signal is equal to or higher than a sum of the potential of said second power supply source and a forward voltage of said diode.

2. A bus driver comprising:

an input terminal;

an output terminal connected to a bus having a bus terminating potential;

a transistor having a control node connected to said input terminal, a first node connected to a first power supply source, and a second node connected to said output terminal, said transistor for controlling a current flow between said second node and said first node in accordance with an input supplied from said input terminal to said control node; and a diode connected between said second node of said transistor and a second power supply source having a potential not higher than said bus terminating potential and not lower than a potential of said first power supply source, said diode forming a one-way current path from the second node of said transistor to said second power supply source when the potential of a bus signal produced by said transistor is equal to or higher than a sum of the potential of said second power supply source and a forward voltage of said diode.

3. The bus driver as claimed in claim 2, wherein said transistor is a MOS transistor.

4. The bus driver as claimed in claim 2, wherein said transistor comprises an NPN transistor.

5. The bus driver as claimed in claim 2, wherein said transistor comprises a PNP transistor.

6. The bus driver as claimed in claim 2, wherein a plurality of diodes are connected to said diode in series.

7. The bus driver as claimed in claim 2, wherein a plurality of diodes are connected to said diode in parallel.

8. The bus driver as claimed in claim 2, wherein the output of said second power supply source is kept at said bus terminating potential.

9. The bus driver as claimed in claim 2, wherein the output of said second power supply source is kept at a potential lower than said bus terminating potential.

10. A bus driver comprising:

an input terminal;

an output terminal connected to a bus having a bus terminating potential;

a transistor for driving a signal applied from said input terminal and outputting the driven signal to said output terminal, said transistor being connected between said output terminal and a first power supply source; and a circuit having a diode and a capacitive element connected between said output terminal and a second power supply source, said second power supply source having a potential not higher than said bus terminating potential and not lower than a potential of said first power supply source, said diode and said capacitive element forming a one-way current path from said output terminal to said second power supply source when the potential of said driven signal is equal to or higher than a sum of the potential of said second power supply source and a forward voltage of said diode.

11. A bus driver comprising:

an input terminal;

an output terminal connected to a bus having a bus terminating potential;

a transistor having a control node connected to said input terminal, a first node connected to a first power supply source, and a second node connected to said output terminal, said transistor for controlling a current flow between said second node and said first node in accordance with an input supplied from said input terminal to said control node; and a circuit provided between said second node of said transistor and a second power supply source having a potential not higher than said bus terminating potential and not lower than a potential of said first power supply source, said circuit having at least one diode and at least one capacitive element for forming a one-way current path from the second node of said transistor to said second power supply source when a potential of a bus signal produced by said transistor is equal to or higher than a sum of the potential of said second power supply source and a forward voltage of said diode.

12. The bus driver as claimed in claim 11, wherein said transistor comprises a MOS transistor.

13. The bus driver as claimed in claim 11, wherein said transistor comprises an NPN transistor.

14. The bus driver as claimed in claim 11, wherein said transistor comprises a PNP transistor.

15. The bus driver as claimed in claim 11, wherein the output of said second power supply source is kept at a potential lower than said bus terminating potential.

16. The bus driver as claimed in claim 11, wherein the output of said second power supply source is kept at a ground potential.

17. The bus driver as claimed in claim 11, wherein said at least one diode and said at least one capacitive element in said circuit are connected in series.

18. The bus driver as claimed in claim 11, wherein said circuit includes:

a capacitive element connected to the second node of said transistor; and a diode having an anode connected to said capacitive element and a cathode connected to said first power supply source.

19. The bus driver as claimed in claim 11, wherein said circuit includes:

a first capacitive element connected to the second node of said transistor;

a second capacitive element connected to said second power supply source; and a diode having an anode connected with said first capacitive element and a cathode connected to said second capacitive element.

20. The bus driver as claimed in claim 11, wherein said circuit includes:

a first capacitive element connected to the second node of said transistor;

a second capacitive element connected to said second power supply source; and a plurality of diodes connected in series and comprising one diode having an anode connected with said first capacitive element and another diode having a cathode connected to said second capacitive element.

* * * * *

UNITED STATES PATENT AND TRADEMARK OFFICE
CERTIFICATE OF CORRECTION

PATENT NO. : 6,057,702
DATED : May 2, 2000
INVENTOR(S) : Hiroshi KAMIYA

It is certified that error appears in the above-identified patent and that said Letters Patent are hereby corrected as shown below:

On the title page of the patent under the section titled "Foreign Application Priority Data" add the following: --May 29, 1996 [JP] Japan ........... 8-134520 --.

Signed and Sealed this

Third Day of April, 2001

*Attest:*

NICHOLAS P. GODICI

*Attesting Officer*     Acting Director of the United States Patent and Trademark Office